United States Patent
Kaida et al.

(10) Patent No.: US 10,205,434 B2
(45) Date of Patent: Feb. 12, 2019

(54) PIEZOELECTRIC RESONATOR UNIT AND METHOD OF MANUFACTURING THE SAME

(71) Applicant: Murata Manufacturing Co., Ltd., Nagaokakyo-shi, Kyoto-fu (JP)

(72) Inventors: Hiroaki Kaida, Nagaokakyo (JP); Kazuyuki Noto, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/814,982

(22) Filed: Nov. 16, 2017

(65) Prior Publication Data

US 2018/0083595 A1    Mar. 22, 2018

Related U.S. Application Data

(63) Continuation of application No. PCT/JP2016/063927, filed on May 10, 2016.

(30) Foreign Application Priority Data

May 29, 2015    (JP) ................. 2015-109455

(51) Int. Cl.
*H03H 9/10*     (2006.01)
*H03H 3/02*     (2006.01)
(Continued)

(52) U.S. Cl.
CPC ........... *H03H 9/10* (2013.01); *H03H 3/02* (2013.01); *H03H 9/02157* (2013.01);
(Continued)

(58) Field of Classification Search
CPC .................... H03H 9/10; H03H 3/02
(Continued)

(56) References Cited

U.S. PATENT DOCUMENTS 5,548,179 A * 8/1996 Kaida ............... H03H 9/02157
                                                                  310/348
5,648,746 A * 7/1997 Kaida ............... H03H 9/02157
                                                                  310/368
(Continued)

FOREIGN PATENT DOCUMENTS

JP    H11-261364 A    9/1999
JP    2011-66651 A    3/2011
(Continued)

OTHER PUBLICATIONS

International Search Report issued for PCT/JP2016/063927, dated Jul. 26, 2016.
(Continued)

*Primary Examiner* — Thomas Dougherty
*Assistant Examiner* — Karen B Addison
(74) *Attorney, Agent, or Firm* — Arent Fox LLP

(57) ABSTRACT

A piezoelectric resonator unit that includes a piezoelectric resonator, a substrate including a protruding portion, and a cap joined to the protruding portion. The piezoelectric resonator unit has a first relation of $(W1+T1) \leq w1 < (W1+2T1)$, where, in a long-side sectional view, w1 is a width of an inside of an opening in the cap, T1 is a width of the protruding portion, and W1 is a width of the upper surface of the substrate between parts of the protruding portion; and has a second relation of $(W2+T2) \leq w2 < (W2+2T2)$, where, in a short-side sectional view, w2 is a width of the inside of the opening in the cap, T2 is a width of the protruding portion, and W2 is a width of the upper surface of the substrate between parts of the protruding portion.

6 Claims, 6 Drawing Sheets

(51) Int. Cl.
  *H03H 9/13*  (2006.01)
  *H03H 9/19*  (2006.01)
  *H03H 9/02*  (2006.01)
  *H03H 9/05*  (2006.01)

(52) U.S. Cl.
  CPC ........ *H03H 9/0519* (2013.01); *H03H 9/1021* (2013.01); *H03H 9/132* (2013.01); *H03H 9/19* (2013.01); *H03H 2003/022* (2013.01)

(58) Field of Classification Search
  USPC ....... 310/320, 348, 366, 367, 368, 370, 321, 310/326, 344, 358, 365, 333, 351, 359, 310/331, 332, 340, 346, 361, 312
  See application file for complete search history.

(56) References Cited

U.S. PATENT DOCUMENTS

| | | | |
|---|---|---|---|
| 5,696,472 A | * | 12/1997 | Kaida ................ H03H 9/02157 310/368 |
| 8,330,336 B2 | | 12/2012 | Kameda et al. |
| 2010/0231094 A1 | | 9/2010 | Kameda et al. |

FOREIGN PATENT DOCUMENTS

| | | |
|---|---|---|
| JP | 2012-191648 A | 10/2012 |
| WO | WO 2009/072351 A1 | 6/2009 |

OTHER PUBLICATIONS

Written Opinion of the Interational Searching Authority issued for PCT/JP2016/063927, dated Jul. 26, 2016.

* cited by examiner

PIEZOELECTRIC RESONATOR UNIT AND METHOD OF MANUFACTURING THE SAME

CROSS REFERENCE TO RELATED APPLICATIONS

The present application is a continuation of International application No. PCT/JP2016/063927, filed May 10, 2016, which claims priority to Japanese Patent Application No. 2015-109455, filed May 29, 2015, the entire contents of each of which are incorporated herein by reference.

FIELD OF THE INVENTION

The present invention relates to a piezoelectric resonator unit and a method of manufacturing the piezoelectric resonator unit.

BACKGROUND OF THE INVENTION

A piezoelectric resonator unit is an example of a piezoelectric device that is used as an oscillation device, a band-pass filter, or the like. A quartz crystal resonator unit, which is an example of a piezoelectric resonator unit, includes a quartz crystal resonator and an enclosure that holds the quartz crystal resonator. The enclosure includes a substrate, on which the quartz crystal resonator is mounted, and a cap (metal cover) that is joined to the substrate via a sealing material. Such a quartz crystal resonator unit is known as an example of a piezoelectric device that is used as an oscillation device, a band-pass filter, or the like (see, for example, Patent Document 1). The cap is open toward the substrate, and, by joining the cap to the substrate via the sealing material, the piezoelectric resonator can be hermetically sealed in the enclosure.

However, with such a structure, the mounting position of the piezoelectric resonator may vary, since an upper surface of the substrate (a surface on which the piezoelectric resonator is mounted) is flat and does not have a guide portion for positioning the piezoelectric resonator. Moreover, when joining the cap to the substrate, the joining position of the cap may vary, and thus the cap may be joined to the substrate in a state in which the cap is in contact with the piezoelectric resonator on the substrate.

Patent Document 1: Japanese Unexamined Patent Application Publication No. 2012-191648

SUMMARY OF THE INVENTION

An object of the present invention, which has been devised against such a background, is to provide a piezoelectric resonator unit in which a piezoelectric resonator can be easily mounted at a predetermined position on a substrate and that can easily improve the accuracy in detecting the joining position where the cap is joined to the substrate and a method of manufacturing the piezoelectric resonator unit.

A piezoelectric resonator unit according to an aspect of the present invention includes: a piezoelectric resonator; a substantially rectangular substrate that has a long-side direction and a short-side direction in plan view and has an upper surface on which the piezoelectric resonator is mounted, the substrate including a protruding portion that is formed along an entire perimeter of the upper surface so as to surround the piezoelectric resonator in plan view, a height of the protruding portion from the upper surface of the substrate being smaller than a height of an upper surface of the piezoelectric resonator from the upper surface of the substrate; and a cap that includes a flat plate portion facing the upper surface of the substrate and an edge portion protruding from the flat plate portion toward the upper surface of the substrate so as to have an opening, the edge portion being joined to the protruding portion of the substrate via a joining material so as to hermetically seal the piezoelectric resonator. The piezoelectric resonator unit has a relation of $W1+T1 \leq w1 < W1+2T1$, where, in a sectional view of the substrate in the long-side direction, $w1$ is a width of an inside of the opening in the cap, $T1$ is a width of the protruding portion of the substrate, and $W1$ is a width of the upper surface of the substrate between parts of the protruding portion; and has a relation of $W2+T2 \leq w2 < W2+2T2$, where, in a sectional view of the substrate in the short-side direction, $w2$ is a width of the inside of the opening in the cap, $T2$ is a width of the protruding portion of the substrate, and $W2$ is a width of the upper surface of the substrate between parts of the protruding portion.

With the structure described above, since the widths $w1$ and $w2$ of the inside of the opening in the cap have the above relations, when the cap is joined to the protruding portion of the substrate, if a part of the end surface of the cap on one side becomes displaced inward beyond the protruding portion and an inner wall of the cap might interfere with the quartz crystal blank, a part of the end surface on the other side becomes displaced outward beyond the protruding portion. In this case, a gap is generated between the end surface of the cap and the substrate, and therefore the piezoelectric resonator is not hermetically sealed. Accordingly, it is possible to determine, by detecting whether the cap and the substrate are hermetically sealed, the conditions as to whether the cap and the substrate might be joined to each other in a state in which a part the end surface of the cap is displaced inward beyond the protruding portion (such as a state in which an inner wall of an edge portion of the cap or the joining material joined to the edge portion interferes with the piezoelectric resonator). Thus, it is possible to detect a defective product by using a method that is not related to electric characteristics. Accordingly, it is possible to easily improve the accuracy in detecting the joining position where the cap is joined to the substrate. Moreover, it is possible to improve reliability by reducing time-varying change in frequency characteristics due to hermetic sealing.

In the piezoelectric resonator unit, the piezoelectric resonator unit may further have a relation of $w1 \leq W1+2T1-2t1$, where, in the sectional view of the substrate in the long-side direction, $t1$ $(0 \leq T1-2t1)$ is a width of an end surface of the cap, the end surface facing the substrate; and may further have a relation of $w2 \leq W2+2T2-2t2$, where, in the sectional view of the substrate in the short-side direction, $t2$ $(0 \leq T31\ 2t2)$ is a width of the end surface of the cap, the end surface facing the substrate.

When the widths $w1$ and $w2$ of the inside of the opening in the cap have the above relations, it is possible to further reliably prevent the end surface of the cap to become displaced outward beyond the protruding portion and to reduce the size of the piezoelectric resonator unit. Accordingly, it is possible to reduce size and increase reliability.

In the piezoelectric resonator unit, the substrate may include a connection electrode formed on the first surface and an extension electrode extending from the connection electrode toward the protruding portion to an outer edge of the substrate, and the piezoelectric resonator may be electrically connected to the connection electrode of the substrate via an electroconductive holding member.

In the piezoelectric resonator unit, the piezoelectric resonator may be a quartz crystal resonator.

In the piezoelectric resonator unit, the substrate may include a base portion that supports the protruding portion, and the base portion and the protruding portion may be integrally formed.

In the piezoelectric resonator unit, the protruding portion of the substrate may be formed along an entire perimeter of an outermost edge of the upper surface of the substrate in plan view.

In the piezoelectric resonator unit, the height of the protruding portion of the substrate from the upper surface of the substrate may be greater than a height of a lower surface of the piezoelectric resonator from the upper surface of the substrate.

A method of manufacturing a piezoelectric resonator unit according to an aspect of the present invention includes: forming a piezoelectric resonator; forming a substantially rectangular substrate that has a long-side direction and a short-side direction in plan view and has an upper surface including a mounting region on which the piezoelectric resonator is to be mounted, the substrate including a protruding portion that is formed along an entire perimeter of the upper surface so as to surround the piezoelectric resonator in plan view, a height of the protruding portion from the upper surface of the substrate being smaller than a height of an upper surface of the piezoelectric resonator from the upper surface of the substrate; mounting the piezoelectric resonator on the mounting region of the upper surface of the substrate; and preparing a cap that includes a flat plate portion facing the upper surface of the substrate and an edge portion protruding from the flat plate portion toward the upper surface of the substrate so as to have an opening, and joining the edge portion of the cap to the protruding portion of the substrate via a joining material so as to hermetically seal the piezoelectric resonator. The piezoelectric resonator unit has a relation of $W1+T1 \le w1 < W1+2T1$, where, in a sectional view of the substrate in the long-side direction, w1 is a width of an inside of the opening in the cap, T1 is a width of the protruding portion of the substrate, and W1 is a width of the upper surface of the substrate between parts of the protruding portion; and has a relation of $W2+T2 \le w2 < W2+2T2$, where, in a sectional view of the substrate in the short-side direction, w2 is a width of the inside of the opening in the cap, T2 is a width of the protruding portion of the substrate, and W2 is a width of the upper surface of the substrate between parts of the protruding portion.

With the method described above, since the widths w1 and w2 of the inside of the opening in the cap have the above relations, when the cap is joined to the protruding portion of the substrate, if a part of the end surface of the cap on one side becomes displaced inward beyond the protruding portion and an inner wall of the cap might interfere with the quartz crystal blank, a part of the end surface on the other side becomes displaced outward beyond the protruding portion. In this case, a gap is generated between the end surface of the cap and the substrate, and therefore the piezoelectric resonator is not hermetically sealed. Accordingly, it is possible to determine, by detecting whether the cap and the substrate are hermetically sealed, the conditions as to whether the cap and the substrate might be joined to each other in a state in which a part the end surface of the cap is displaced inward beyond the protruding portion (such as a state in which an inner wall of an edge portion of the cap or the joining material joined to the edge portion interferes with the piezoelectric resonator). Thus, it is possible to detect a defective product by using a method that is not related to electric characteristics. Accordingly, it is possible to easily improve the accuracy in detecting the joining position where the cap is joined to the substrate. Moreover, it is possible to improve reliability by reducing time-varying change in frequency characteristics due to hermetic sealing.

In the method of manufacturing a piezoelectric resonator unit, the piezoelectric resonator unit may further have a relation of $w1 \le W1+2T1-2t1$, where, in the sectional view of the substrate in the long-side direction, t1 ($0 \le T1-2t1$) is a width of an end surface of the cap, the end surface facing the substrate; and may further have a relation of $w2 \le W2+2T2-2t2$, where, in the sectional view of the substrate in the short-side direction, t2 ($0 \le T2-2t2$) is a width of the end surface of the cap, the end surface facing the substrate.

When the widths w1 and w2 of the inside of the opening in the cap have the above relations, it is possible to further reliably prevent the end surface of the cap to become displaced outward beyond the protruding portion and to reduce the size of the piezoelectric resonator unit. Accordingly, it is possible to reduce size and increase reliability.

With the present invention, it is possible to easily mount a piezoelectric resonator at a predetermined position on a substrate and to easily improve the accuracy in detecting the joining position where a cap is joined to the substrate.

DETAILED DESCRIPTION OF THE PREFERRED EMBODIMENTS

Figure 1:
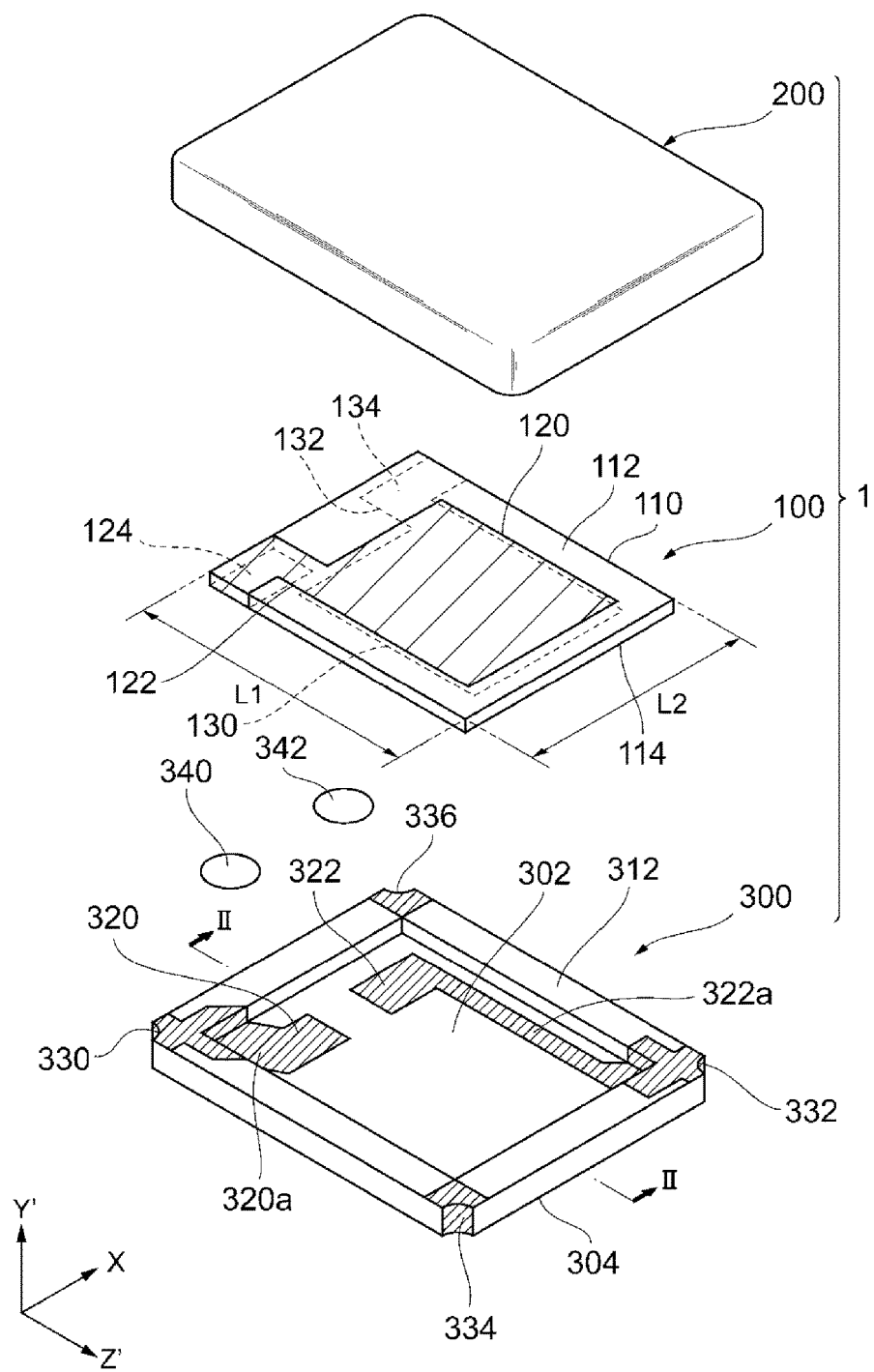
FIG. 1 is an exploded perspective view of a piezoelectric resonator unit according to an embodiment.

Hereinafter, an embodiment of the present invention will be described. In the following descriptions with reference to the drawings, elements that are the same as each other or similar to each other are denoted by the same or similar numerals. The drawings show examples and the dimensions and shapes of elements in the drawings are schematic, and the embodiment does not limit the scope of the present invention.

Referring to FIGS. 1 to 3C, a piezoelectric resonator unit according to the present embodiment will be described. FIG.

Figure 2A:
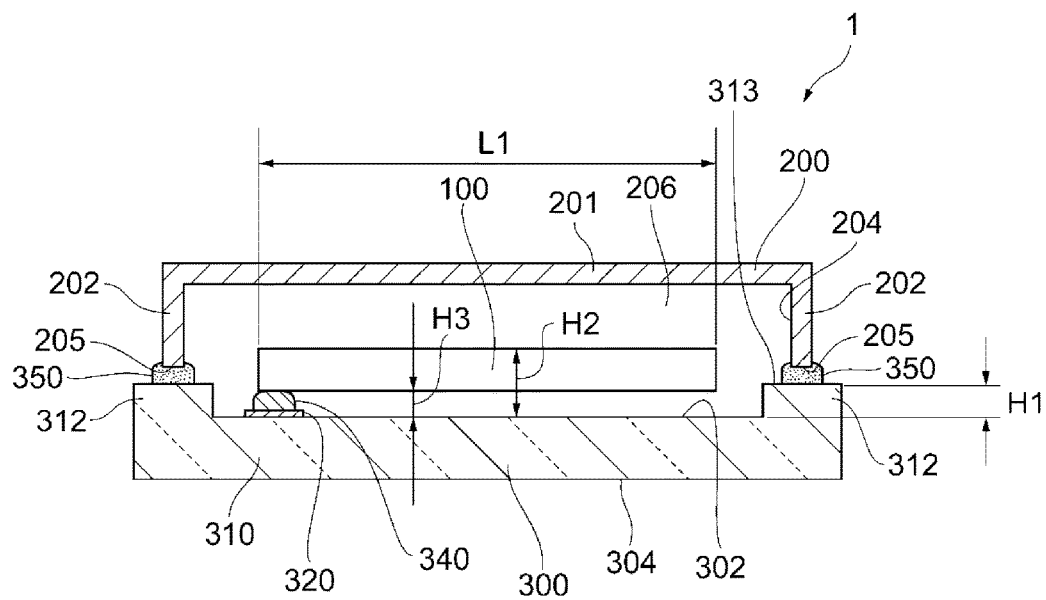
FIG. 2A is a sectional view taken along line II-II of FIG. 1, illustrating a case where an edge portion of a cap according to the present embodiment is joined to a protruding portion.
Figure 2B:
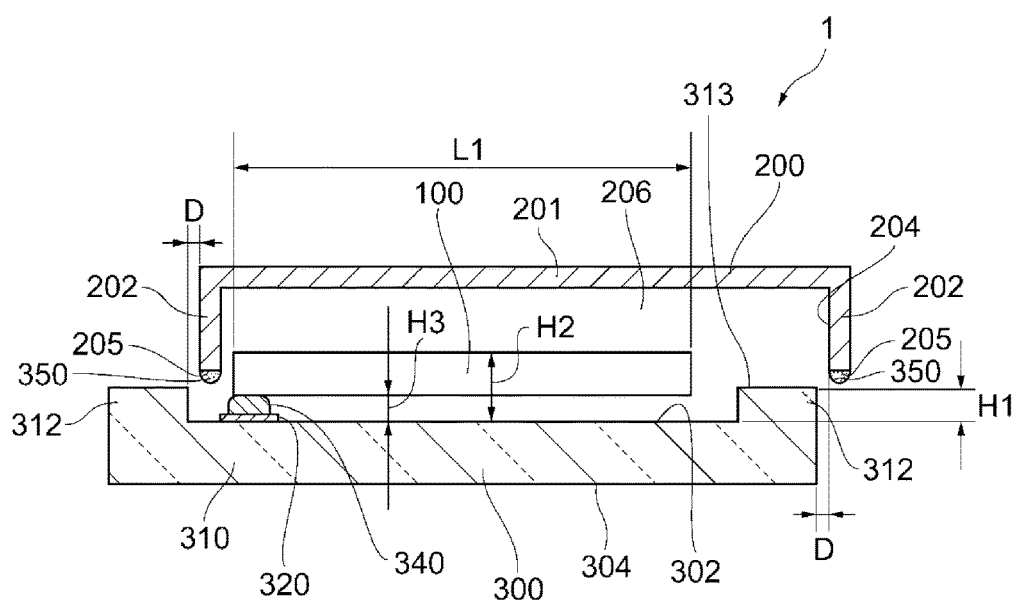
FIG. 2B is a sectional view taken along line II-II of FIG. 1, illustrating a case where the edge portion of the cap according to the present embodiment is displaced from an upper surface of the protruding portion.
Figure 3A:
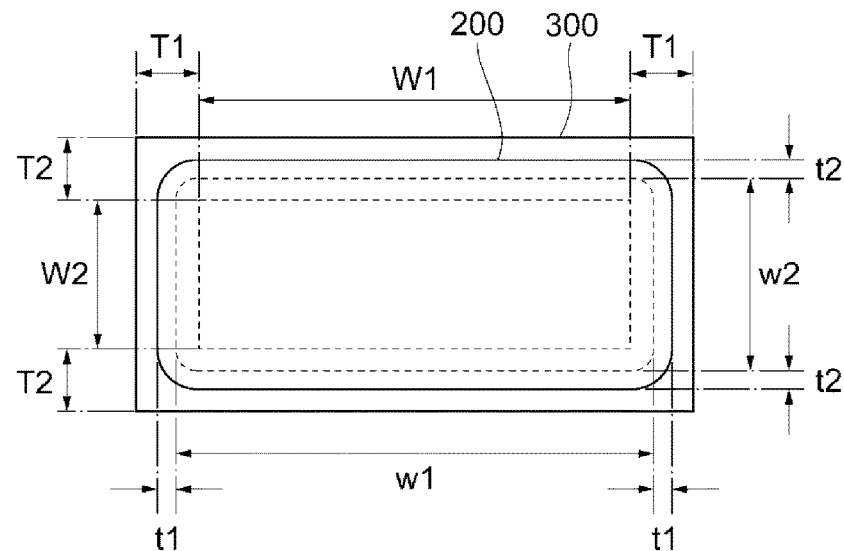
FIG. 3A illustrates the structures of the cap and the substrate of the piezoelectric resonator unit according to the present embodiment.
Figure 3B:
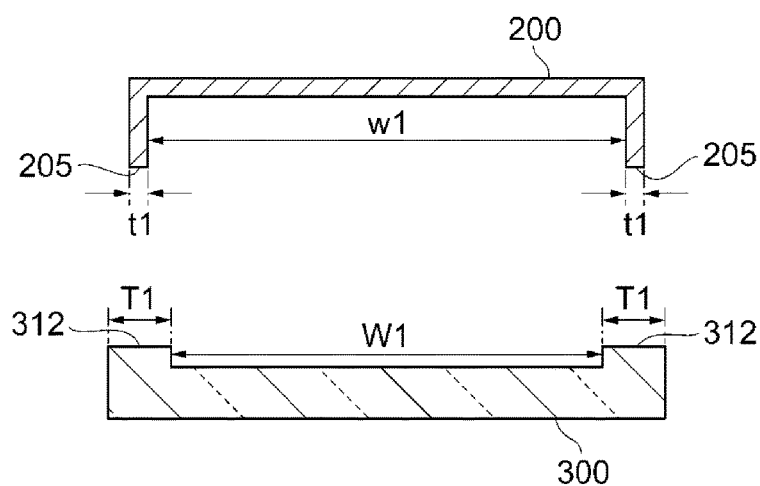
FIG. 3B illustrates the structures of the cap and the substrate of the piezoelectric resonator unit according to the present embodiment.
Figure 3C:
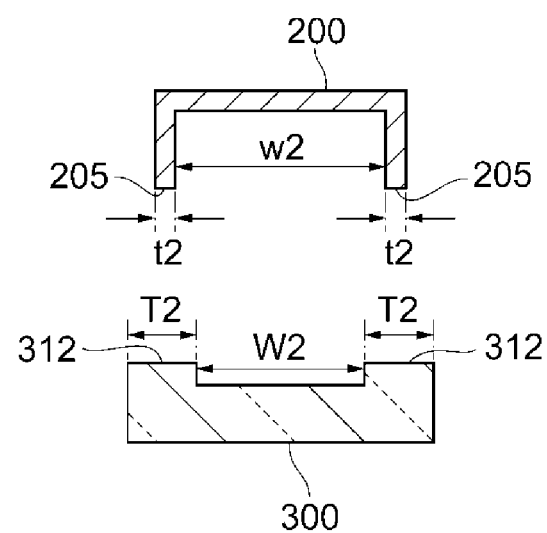
FIG. 3C illustrates the structures of the cap and the substrate of the piezoelectric resonator unit according to the present embodiment.

1 is an exploded perspective view of the piezoelectric resonator unit. FIGS. 2A and 2B are sectional views taken along line II-II of FIG. 1. FIGS. 3A to 3C illustrate the structures of a cap and a substrate of the piezoelectric resonator unit according to the present embodiment. A joining material, which is illustrated in FIGS. 2A and 2B, is not illustrated in FIG. 1.

As illustrated in FIG. 1, a piezoelectric resonator unit 1 according to the present embodiment includes a piezoelectric resonator 100, a cap 200, and a substrate 300. The cap 200 and the substrate 300 serve as an enclosure that holds the piezoelectric resonator 100. A case or a package having a sealed space for accommodating the piezoelectric resonator 100 is formed by joining the cap 200 to the substrate 300 via a joining material.

The piezoelectric resonator 100 includes a piezoelectric substrate 110 and first and second excitation electrodes 120 and 130 formed on the piezoelectric substrate 110. The first excitation electrode 120 is formed on a first surface 112 of the piezoelectric substrate 110, and the second excitation electrode 130 is formed on a second surface 114, which is opposite to the first surface 112, of the piezoelectric substrate 110.

The piezoelectric substrate 110 is made of a predetermined piezoelectric material, which is not particularly limited. In the example illustrated in FIG. 1, the piezoelectric substrate 110 is an AT-cut quartz crystal blank. An AT-cut quartz crystal blank is cut so that, when an X axis, a Y axis, and a Z axis are the crystal axes of a synthetic quartz crystal and a Y' axis and a Z' axis are respectively axes that are obtained by rotating the Y axis and the Z axis around the X axis by 35 degrees 15±1 minutes 30 seconds in a direction from the Y axis toward the Z axis, the quartz crystal blank has a main surface that is parallel to a plane defined by the X axis and the Z' axis (hereinafter, referred to as "XZ'-plane", and the same applies to planes defined by other axes). In the example illustrated in FIG. 1, the piezoelectric substrate 110, which is an AT-cut quartz crystal blank, has a long-side direction parallel to the Z' axis, a short-side direction parallel to the X axis, and a thickness direction parallel to the Y' axis. The piezoelectric substrate 110 has a substantially rectangular shape when the XZ'-plane is seen in plan view. A quartz crystal resonator using an AT-cut quartz crystal blank has high frequency stability in a wide temperature range, has high durability, and can be manufactured at low cost. Typically, a vibration in a thickness sheer mode is used as a main vibration of an AT-cut quartz crystal resonator.

A piezoelectric substrate according to the present embodiment is not limited to the one described above. For example, the piezoelectric substrate may be an AT-cut quartz crystal blank having a long-side direction parallel to the X axis and a short-side direction parallel to the Z' axis, or may be a quartz crystal blank that is cut in a manner different from an AT cut. Alternatively, the piezoelectric substrate may be made of a piezoelectric material that is not a quartz crystal, such as a ceramic material.

The first excitation electrode 120 is formed on the first surface 112 (a surface parallel to the XZ'-plane and on the positive Y' side) of the piezoelectric substrate 110, and the second excitation electrode 130 is formed on the second surface 114 (a surface parallel to the XZ'-plane and on the negative Y' side) of the piezoelectric substrate 110, which is opposite to the first surface 112. The first and second excitation electrodes 120 and 130 are a pair of electrodes that overlap each other in the XZ'-plane.

On the piezoelectric substrate 110, a connection electrode 124, which is electrically connected to the first excitation electrode 120 via an extension electrode 122, and a connection electrode 134, which is electrically connected to the second excitation electrode 130 via an extension electrode 132, are formed. To be specific, the extension electrode 122 extends on the first surface 112 from the first excitation electrode 120 toward a short side on the negative Z' side, passes along a side surface of the piezoelectric substrate 110 on the negative Z' side, and is connected to the connection electrode 124 formed on the second surface 114. The extension electrode 132 extends on the second surface 114 from the second excitation electrode 130 toward the short side on the negative Z' side, and is connected to the connection electrode 134 formed on the second surface 114. The connection electrodes 124 and 134 are disposed along the short side on the negative Z' side. The connection electrodes 124 and 134 are electrically connected to and mechanically held by the substrate 300 via electroconductive holding members 340 and 342 (described below). In the present embodiment, the dispositions and the pattern shapes of the connection electrodes 124 and 134 and the extension electrodes 122 and 132 are not particularly limited and may be appropriately changed in consideration of electrical connections with other members.

The electrodes described above, including the first and second excitation electrodes 120 and 130, may each include a chrome (Cr) underlying layer and a gold (Au) layer formed on the surface of the chrome layer. The materials of these electrodes are not particularly limited.

The cap 200 includes a flat plate portion 201 and an edge portion 202. The flat plate portion 201 faces a first surface (upper surface) 302 of the substrate 300. The edge portion 202 is located around the flat plate portion 201 and protrudes from the flat plate portion 201 so as to have an opening. The cap 200 has a recessed portion 204 that is open toward the first surface (upper surface) 302 of the substrate 300. The recessed portion 204 is provided with the edge portion 202, which is formed along the entire perimeter of an opening of the flat plate portion 201 so as to stand on the bottom surface of the recessed portion 204. The edge portion 202 has an end surface 205 that faces the first surface 302 of the substrate 300. As illustrated in FIG. 2A, the end surface 205 may be an end surface of the edge portion 202, which protrudes so as to stand substantially perpendicularly on the bottom surface of the recessed portion 204. The material of the cap 200 may be, for example, a metal. In this case, the cap 200 can additionally have a shielding function by being electrically connected to a ground potential. Alternatively, the cap 200 may be made of an insulating material, or may have a composite structure composed of a metal and an insulating material.

The piezoelectric resonator 100 is mounted on a mounting region of the first surface 302 of the substrate 300. In the example illustrated in FIG. 1, the substrate 300 has a long-side direction parallel to the Z' axis, a short-side direction parallel to the X axis, and a thickness direction parallel to the Y' axis. The substrate 300 has a substantially rectangular shape in the XZ'-plane. The substrate 300 may be made of, for example, an insulating ceramic material, a glass material, or a quartz crystal material. The substrate 300 may be composed of a single layer or a plurality of layers. If the substrate 300 is composed of a plurality of layers, the substrate 300 may include an insulating layer as the uppermost layer of the first surface 302. As illustrated in FIG. 2A, by joining the cap 200 and the substrate 300 to each other via a joining material 350, the piezoelectric resonator 100 is hermetically sealed in an inner space (cavity) 206 that is surrounded by the recessed portion 204 of the cap 200 and the substrate 300. In the example illustrated in FIG. 2A, one end of the piezoelectric resonator 100 (an end portion near the electroconductive holding members 340 and 342) is a fixed end, and the other end of the piezoelectric resonator 100 is a free end.

The substrate 300 includes a base portion 310 and a protruding portion 312. The protruding portion 312 is supported by the base portion 310 and is formed along the entire perimeter of the first surface 302 so as to surround the piezoelectric resonator 100. As illustrated in FIG. 2A, the base portion 310 and the protruding portion 312 are integrally formed. For example, the base portion 310 and the protruding portion 312 can be integrally formed by stacking plate-shaped insulating ceramic sheets and by firing the ceramic sheets. As illustrated in FIG. 1, the piezoelectric resonator 100 has a length L1 in the long-side direction and a length L2 in the short-side direction. In the present embodiment, L1 is 0.8 mm, and L2 is 0.6 mm.

As illustrated in FIG. 2A, the protruding portion 312 protrudes to a height above the first surface 302 of the substrate 300, on which the piezoelectric resonator 100 is mounted. The height H1 of an upper surface 313 of the protruding portion 312 from the first surface 302 of the substrate 300 is smaller than the height H2 of an upper surface (the first surface 112 on which the first excitation electrode 120 is formed) of the piezoelectric resonator 100, which is mounted on the substrate 300, from the first surface 302. The protruding portion 312 functions as a guide for positioning the piezoelectric resonator 100 when mounting the piezoelectric resonator 100. As illustrated in FIG. 2B, the height H1 of the upper surface 313 of the protruding portion 312 from the first surface 302 of the substrate 300 may be greater than the height H3 of a lower surface of the piezoelectric resonator 100 from the first surface 302 of the substrate 300. In this case, when the mounting position of the piezoelectric resonator 100 on the substrate 300 becomes displaced, the piezoelectric resonator 100 contacts the upper surface of the protruding portion 312, and thereby the displacement of the mounting position can be detected. Alternatively, the height H1 of the upper surface 313 of the protruding portion 312 from the first surface 302 of the substrate 300 may be smaller than the height H3 of the lower surface of the piezoelectric resonator 100 from the first surface 302 of the substrate 300. In this case, the height of the protruding portion 312 can be reduced, and therefore the protruding portion can be formed easily. As illustrated in FIG. 2A, the protruding portion 312 is formed along the entire perimeter of the outermost edge of the upper surface 302 of the substrate 300. The end surface 205 of the edge portion 202 of the cap 200 is joined to the protruding portion 312 of the substrate 300 via the joining material 350. A second surface 304 of the substrate 300, which is opposite to the first surface 302, is a flat surface.

As illustrated in FIG. 1, the substrate 300 includes connection electrodes 320 and 322, which are formed on the first surface 302, and extension electrodes 320a and 322a, which extend from the connection electrodes 320 and 322 toward the protruding portion 312 to the outer edge of the substrate 300. To the connection electrode 320, the connection electrode 124 of the piezoelectric resonator 100 is connected via the electroconductive holding member 340. To the connection electrode 322, the connection electrode 134 of the piezoelectric resonator 100 is connected via the electroconductive holding member 342. The extension electrode 320a extends from the connection electrode 320 toward one of the corners of the substrate 300. The extension electrode 322a extends from the connection electrode 322 to another of the corners of the substrate 300. A plurality of outer electrodes 330, 332, 334, and 336 are formed at the corners of the substrate 300. In the example illustrated in FIG. 1, the extension electrode 320a is connected to the outer electrode 330 formed at the corner in the negative X-direction and negative Z'-direction, and the extension electrode 322a is connected to the outer electrode 332 formed at the corner in the positive X-direction and positive Z'-direction. As illustrated in FIG. 1, the outer electrodes 334 and 336 may be formed at the remaining corners. The outer electrodes 334 and 336 may be dummy patterns that are not electrically connected to the piezoelectric resonator 100. By forming such dummy patterns, an electroconductive material for forming the outer electrodes can be easily applied. Moreover, because the outer electrodes can be formed at all of the corners, a step of electrically connecting the piezoelectric resonator unit to another component can be easily performed.

In the example illustrated in FIG. 1, each of the corners of the substrate 300 has a cutout side surface that is formed by partially cutting out the corner in a cylindrically-curved shape (also referred to as a castellation shape). The outer electrodes 330, 332, 334, and 336 are formed so as to be continuous with the cutout side surfaces and the second surface 304. The shape of each of the corners of the substrate 300 is limited to this shape. Each of the corners may be cut out so as to have a flat shape, or may have an angled corner without being cut out.

The structures of the connection electrodes, the extension electrodes, and the outer electrodes of the substrate 300 are not limited to those described above, and may be modified in various ways. The connection electrodes 320 and 322 may be disposed on different sides on the first surface 302 of the substrate 300. For example, one of the connection electrodes 320 and 322 may be formed on the positive Z' side and the other may be disposed on the negative Z' side. With such a structure, the piezoelectric resonator 100 is supported by the substrate 300 at both ends in the long-side direction. The number of the outer electrodes is not limited to four, and only two outer electrodes may be disposed at opposite corners. The outer electrodes need not be disposed at the corners, and may be formed on one of the side surfaces of the substrate 300 excluding the corners. In this case, cutout side surfaces may be formed by partially cutting out the side surface so as to form cylindrically-curved surfaces as described above, and the outer electrodes may be formed on the side surface excluding corners. The outer electrode 334 and 336, which are dummy patterns, need not be formed. A through-hole may be formed in the substrate 300 so as to extend from the first surface 302 to the second surface 304, and a connection electrode on the first surface 302 may be electrically connected to the second surface 304 through the through-hole. In this case, it is not necessary to form an electrode so as to extend to the protruding portion 312 of the substrate 300, and therefore the electrode can be easily formed.

With the piezoelectric resonator unit 1 according to the present embodiment, when an alternating-current voltage is applied between the pair of first and second excitation electrodes 120 and 130 of the piezoelectric resonator 100 via the outer electrodes 330 and 332, the piezoelectric substrate 110 vibrates in a predetermined vibration mode, such as a thickness shear mode, and resonance characteristics in accordance with the vibration can be obtained.

As illustrated in FIGS. 3A to 3C, in the piezoelectric resonator unit according to the present embodiment, the sizes of the cap and the substrate have predetermined relations. FIG. 3A is a plan view of the cap and the substrate. FIG. 3B is a sectional view taken along a plane passing through the center of the substrate in the short-side direction and extending in the long-side direction. FIG. 3C is a sectional view taken along a plane passing through the center of the substrate in the long-side direction and extending in the short-side direction.

To be specific, the piezoelectric resonator unit has a relation of $W1+T1 \leq w1 < W1+2T1$, where, in a sectional view (see FIG. 3B) of the substrate 300 in the long-side direction, w1 is the width between inner walls that face each other at a central portion of the opening in the cap 200, T1 is the width of the protruding portion 312 of the substrate 300, and W1 is the width of the upper surface of the substrate 300 between parts of the protruding portion 312; and has a relation of $W2+T2 \leq w2 < W2+2T2$, where, in a sectional view (see FIG. 3C) of the substrate 300 in the short-side direction, w2 is the width between inner walls that face each other at a central portion of the opening in the cap 200, T2 is the width of the protruding portion 312 of the substrate 300, and W2 is the width of the upper surface of the substrate 300 between parts of the protruding portion 312.

Since the widths w1 and w2 of the inside of the opening in the cap 200 have the above relations, when the cap 200 is joined to the protruding portion 312 of the substrate 300, if a part of the end surface 205 of the cap 200 on one side becomes displaced inward beyond the protruding portion 312 as illustrated in FIG. 2B and an inner wall of the cap 200 might interfere with the quartz crystal blank, a part of the end surface 205 on the other side becomes displaced outward beyond the protruding portion 312. In this case, a gap is generated between the end surface of the cap 200 and the substrate 300, and therefore the piezoelectric resonator 100 is not hermetically sealed. Accordingly, it is possible to determine, by detecting whether the cap 200 and the substrate 300 are hermetically sealed, the conditions as to whether the cap 200 and the substrate 300 might be joined to each other in a state in which a part the end surface 205 of the cap 200 is displaced inward beyond the protruding portion 312 (such as a state in which an inner wall of an edge portion of the cap 200 or the joining material 350 joined to the edge portion interferes with the piezoelectric resonator 100). Thus, it is possible to detect a defective product by using a method other than an electric characteristics test. Moreover, a gap between an inner surface of the protruding portion 312 of the substrate 300 and an outer surface of the cap 200 can be detected by using an image of the device in plan view. Therefore, it is possible to detect a defective product in which the joining position where the cap 200 is joined to the substrate 300 is displaced. Accordingly, it is possible to easily improve the accuracy in detecting the joining position where the cap 200 is joined to the substrate 300 by performing a hermetic sealing test or by image recognition. Moreover, it is possible to improve reliability by reducing time-varying change in frequency characteristics due to hermetic sealing. As the mounting area of a piezoelectric resonator unit has become as small as 1.2 mm×1.0 mm, there may be a case where a piezoelectric resonator unit is designed such that the distance D between the piezoelectric resonator 100 and the protruding portion 312 in plan view is smaller than or equal to 2.0×t1 when the piezoelectric resonator 100 is mounted at a predetermined position on the substrate 300. The present invention can be effectively used in such a small design. Moreover, the present invention can be effectively used in a case where the distance D is smaller than or equal to 1.5×t1. The present invention can be effectively used in a case where the distance D is smaller than or equal to 15 μm.

Preferably, the piezoelectric resonator unit according to the present embodiment has a relation of $W1+T1 \leq w1 \leq W1+2T1-2t1$, where, in the sectional view (see FIG. 3B) of the substrate 300 in the long-side direction, t1 ($0 \leq T1-2t1$) is the width of the end surface 205 of the cap 200 facing the substrate 300; and has a relation of $W2+T2 < w2 \leq W2+2T2-2t2$, where, in the sectional view (see FIG. 3C) of the substrate 300 in the short-side direction, t2 ($0 \leq T2-2t2$) is the width of the end surface 205 of the cap 200 facing the substrate 300.

When the widths w1 and w2 of the inside of the opening in the cap 200 have the above relations, it is possible to further reliably prevent the end surface 205 of the cap 200 to become displaced outward beyond the protruding portion 312 and to reduce the size of the piezoelectric resonator unit. Accordingly, it is possible to provide a piezoelectric resonator unit that can be reduced in size and increased in reliability.

In the example illustrated in FIGS. 3A to 3C, the widths of left and right parts of the end surface 205 of the cap 200 in the sectional views are the same. However, this is not a limitation and the widths may differ from each other. In this case, the piezoelectric resonator unit may have the above relations where t1 (or t2) is the average of the widths of the left and right parts of the end surface 205. The width t1 of the end surface 205 in the sectional view (see FIG. 3B) in the long-side direction and the width t2 of the end surface 205 in the sectional view (see FIG. 3C) in the short-side direction may be the same as each other or may be different from each other.

Regarding the width of the protruding portion 312 of the substrate 300, in the example illustrated in FIGS. 3A to 3C, the widths of left and right parts of the protruding portion 312 of the substrate 300 in the sectional views are the same. However, this is not a limitation and the widths may differ from each other. In this case, the piezoelectric resonator unit may have the above relations where T1 (or T2) is the average of the widths of the left and right parts of the protruding portion 312. The width T1 of the protruding portion 312 in the sectional view (see FIG. 3B) in the long-side direction and the width T2 of the protruding portion 312 in the sectional view (see FIG. 3C) in the short-side direction, which are denoted by different symbols for convenience of description, may be the same as each other or may be different from each other.

As described above, with the piezoelectric resonator unit according to the present embodiment, it is possible to easily mount the piezoelectric resonator 100 at a mounting position on the substrate 300 and to increase the accuracy of the joining position where the cap 200 is joined to the substrate 300.

Figure 4:
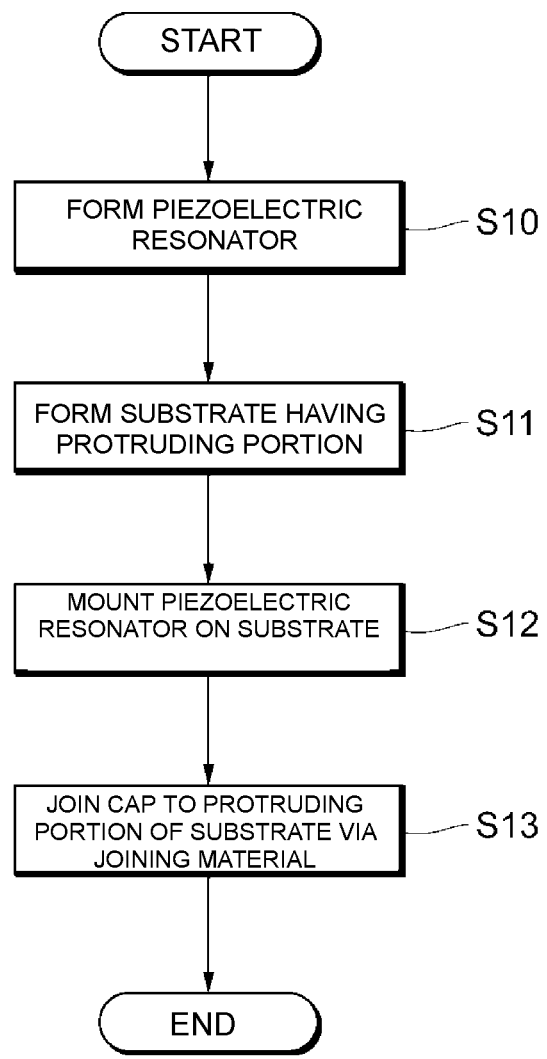
FIG. 4 is a flowchart of a method of manufacturing a piezoelectric resonator unit according to the present embodiment.

Next, referring to FIG. 4, a method of manufacturing a piezoelectric resonator unit according to the present embodiment will be described.

First, a piezoelectric resonator 100 is formed (S10). When forming a quartz crystal resonator as the piezoelectric resonator 100, first, a quartz crystal material is cut into a wafer from a synthetic quartz crystal or a rough natural quartz crystal at a predetermined angle; the wafer is cut by using a dicing machine or by being etched so as to have a predetermined rectangular outer shape; and subsequently, electrodes, such as first and second excitation electrodes 120 and 130, are formed by sputtering or vapor deposition (see FIG. 1).

Next, a protruding portion 312 if formed in a substrate 300 (S11). The material of the substrate 300 may be, for example, a ceramic material. In this case, by stacking plate-shaped insulating ceramic sheets and firing the ceramic sheets, the protruding portion 312 and a base portion 310 that supports the protruding portion 312 may be integrally formed. Moreover, connection electrodes 320 and 322 and extension electrodes 320a and 322a are formed on a first surface 302 of the substrate 300. For example, a paste-like electroconductive material is applied to a predetermined region of the first surface 302 of the substrate 300, and the applied electroconductive material is fired. The electroconductive material may be formed by sputtering, vapor deposition, or the like.

Next, the piezoelectric resonator 100 is mounted on the first surface 302 of the substrate 300 (S12). To be specific, electroconductive holding members 340 and 342 are applied to the connection electrodes 320 and 322, connection electrodes 124 and 134 of the piezoelectric resonator 100 are connected to the connection electrodes 320 and 322 of the substrate 300 via the electroconductive holding members 340 and 342, and the electroconductive holding members 340 and 342 are hardened. Thus, the piezoelectric resonator 100 can be electrically connected to the electrodes of the substrate 300.

Subsequently, a cap 200 is joined to the protruding portion 312 of the substrate 300 via a joining material 350 (S13). For example, when the joining material 350 is a resin adhesive, a paste-like resin adhesive is applied to an end surface 205 of the cap 200 (see FIG. 2A) by using a dipping method or the like, and, subsequently, the cap 200 can be joined to the substrate 300 via the joining material 350.

With the method of manufacturing a piezoelectric resonator unit according to the present embodiment, since the sizes of the cap and the substrate have predetermined relations as described above, it is possible to improve the accuracy of the joining position where the cap 200 is joined to the substrate 300 and to improve reliability.

The present invention is not limited to the embodiment described above and may be modified in various ways. In the following description, only differences from the embodiment will be described, and elements that are the same as those of the embodiment will be denoted by the same numerals.

Figure 5:
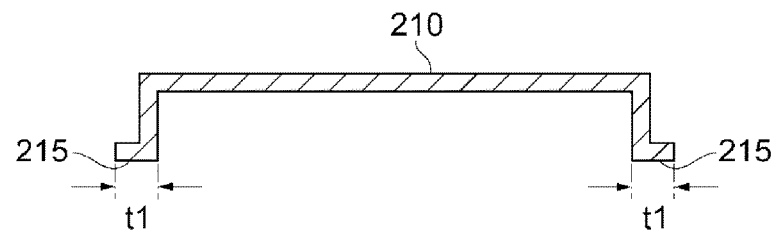
FIG. 5 illustrates a piezoelectric resonator unit according to a modification of the present embodiment.

FIG. 5 illustrates a piezoelectric resonator unit according to a modification, which specifically differs from the embodiment in the structure of a cap.

As illustrated in FIG. 5, a cap 210 may include a flange portion that protrudes from the edge of the opening in the recessed portion in a direction from the center of the opening toward the edge of the opening. The flange portion may have an end surface 215 that faces the first surface of the substrate. Except that the cap 210 of the piezoelectric resonator unit has the end surface 215 of the flange portion, the structure described above can be used for the piezoelectric resonator unit according to the present modification. In this case, the size of the end surface 215 can be increased, and joint strength between the cap 210 and the substrate can be increased.

Figure 6:
FIG. 6 illustrates a piezoelectric resonator unit according to another modification of the present embodiment.
Figure 7:
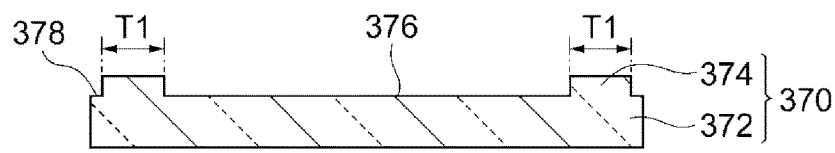
FIG. 7 illustrates a piezoelectric resonator unit according to another modification of the present embodiment.

FIGS. 6 and 7 illustrate piezoelectric resonator units according to modifications, each of which specifically differs from the embodiment in the structure of a substrate.

As illustrated in FIG. 6, a substrate 360 may include a base portion 362 and a protruding portion 364 that is formed independently from the base portion 362. The protruding portion 364 may be joined to the base portion 362 via a joining material (not shown). The protruding portion 364 protrudes to a height above a first surface 366 of the substrate 360, on which a piezoelectric resonator is to be mounted. The protruding portion 364 and the base portion 362 may be made of the same material (such as the same insulating ceramic material) or may be made of different materials. (For example, the base portion may be made of an insulating ceramic material, and the protruding portion may be made of an organic insulating film or an inorganic insulation film different from the base portion.) Except that the protruding portion is formed independently from the base portion, the piezoelectric resonator unit may have the same structure as the embodiment described above. In this case, since the protruding portion is formed independently from the base portion, a substrate having the protruding portion can be easily formed.

As illustrated in FIG. 7, a substrate 370 may include a protruding portion 374 that is formed inside of an outermost edge 378 of the substrate 370 along the entire perimeter of a first surface 376. A base portion 372 of the substrate 370 may be integrally formed with the protruding portion 374, or may be formed independently from the protruding portion 374. Except that the protruding portion 374 is formed inside of the outermost edge 378, the structure described above can be used for the piezoelectric resonator unit according to the present modification.

With each of the piezoelectric resonator units according to these modifications and a method of manufacturing the piezoelectric resonator unit, as describe above in detail, since the sizes of the cap and the substrate have predetermined relations, it is possible to increase the accuracy of the joining position where the cap is joined to the substrate can be increased and to improve reliability.

The embodiment is described above in order to facilitate understating of the present invention and does not limit the scope of the present invention. The present invention can be modified/improved within the scope and sprit thereof, and the present invention includes the equivalents thereof. That is, embodiments that are appropriately modified in design are included in the scope of the present invention, as long as such modifications have features of the present invention. For example, the dispositions, materials, shapes, and sizes of elements of the embodiments are not limited to the examples described above and may be changed as appropriate. Elements of the embodiments may be used in any combination as long as the combination is technologically feasible, and such combinations are within the scope of the present invention as long as they include the features of the present invention.

REFERENCE SIGNS LIST 1 piezoelectric resonator unit
100 piezoelectric resonator
200 cap
205 end surface
300 substrate
310 base portion
312 protruding portion
320, 322 connection electrode
320a, 322a extension electrode
350 joining material

The invention claimed is:
1. A piezoelectric resonator unit comprising:
a piezoelectric resonator;

a rectangular substrate that has a long-side direction and a short-side direction in a plan view thereof and has an upper surface on which the piezoelectric resonator is mounted, the substrate including a protruding portion along an entire perimeter of the upper surface so as to surround the piezoelectric resonator in the plan view, a height of the protruding portion from the upper surface of the substrate is smaller than a height of an upper surface of the piezoelectric resonator from the upper surface of the substrate; and a cap that includes a flat plate portion facing the upper surface of the substrate and an edge portion protruding from the flat plate portion toward the upper surface of the substrate so as to define an opening, the edge portion being joined to the protruding portion of the substrate via a joining material so as to hermetically seal the piezoelectric resonator between the cap and the substrate, wherein the piezoelectric resonator unit has a first relation of $$W1+T1 \leq w1 < W1+2T1,$$

where, in a sectional view of the substrate in the long-side direction, w1 is a width of an inside of the opening in the cap, T1 is a width of the protruding portion of the substrate, and W1 is a width of the upper surface of the substrate between parts of the protruding portion, has a second relation of $$W2+T2 \leq w2 < W2+2T2,$$

where, in a sectional view of the substrate in the short-side direction, w2 is a width of the inside of the opening in the cap, T2 is a width of the protruding portion of the substrate, and W2 is a width of the upper surface of the substrate between parts of the protruding portion, has a third relation of $$w1 \leq W1+2T1-2t1,$$

where, in the sectional view of the substrate in the long-side direction, t1 ($0 \leq T1-2t1$) is a width of an end surface of the cap, the end surface facing the substrate, and has a fourth relation of $$w2 \leq W2+2T2-2t2,$$

where, in the sectional view of the substrate in the short-side direction, t2 ($0 \leq T2-2t2$) is a width of the end surface of the cap, the end surface facing the substrate.

2. The piezoelectric resonator unit according to claim 1, further comprising:

a connection electrode formed on the upper surface and an extension electrode extending from the connection electrode toward the protruding portion to an outer edge of the substrate, and wherein the piezoelectric resonator is electrically connected to the connection electrode of the substrate via an electroconductive holding member.

3. The piezoelectric resonator unit according to claim 1, wherein the piezoelectric resonator is a quartz crystal resonator.

4. The piezoelectric resonator unit according to claim 1, wherein the substrate includes a base portion that supports the protruding portion, and wherein the base portion and the protruding portion are integral.

5. The piezoelectric resonator unit according to claim 1, wherein the protruding portion of the substrate extends along an entire perimeter of an outermost edge of the upper surface of the substrate in the plan view.

6. The piezoelectric resonator unit according to claim 1, wherein the height of the protruding portion of the substrate from the upper surface of the substrate is greater than a height of a lower surface of the piezoelectric resonator from the upper surface of the substrate.

* * * * *